US006967861B2

(12) United States Patent
Braceras et al.

(10) Patent No.: US 6,967,861 B2
(45) Date of Patent: Nov. 22, 2005

(54) METHOD AND APPARATUS FOR IMPROVING CYCLE TIME IN A QUAD DATA RATE SRAM DEVICE

(75) Inventors: George M. Braceras, Essex Junction, VT (US); Harold Pilo, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 10/708,379

(22) Filed: Feb. 27, 2004

(65) Prior Publication Data
US 2005/0190640 A1    Sep. 1, 2005

(51) Int. Cl.[7] ............................................. G11C 11/00
(52) U.S. Cl. .................. 365/154; 365/156; 365/230.05
(58) Field of Search ................................ 365/154, 156, 365/230.05, 233, 194

(56) References Cited

U.S. PATENT DOCUMENTS

| 5,381,363 A | * | 1/1995 | Bazes ........................ 365/51 |
| 6,091,629 A | * | 7/2000 | Osada et al. ............... 365/156 |
| 6,201,757 B1 | * | 3/2001 | Ward et al. ............ 365/230.05 |
| 6,381,684 B1 | | 4/2002 | Hronik et al. ............... 711/167 |
| 6,424,198 B1 | | 7/2002 | Wolford ........................ 327/291 |
| 6,600,693 B2 | | 7/2003 | Kim ............................ 365/233 |
| 6,862,208 B2 | * | 3/2005 | Palmer et al. ............... 365/154 |
| 2002/0060949 A1 | | 5/2002 | Kim ............................ 365/233 |

* cited by examiner

Primary Examiner—Anh Phung
(74) Attorney, Agent, or Firm—Robert A. Walsh; Cantor Colburn LLP

(57) ABSTRACT

A method for implementing a self-timed, read to write operation in a memory storage device. In an exemplary embodiment, the method includes capturing a read address during a first half of a current clock cycle, and commencing a read operation so as to read data corresponding to the captured read address onto a pair of bit lines. A write operation is commenced for the current clock cycle so as to cause write data to appear on the pair of bit lines as soon as the read data from the captured read address is amplified by a sense amplifier, wherein the write operation uses a previous write address captured during a preceding clock cycle. A current write address is captured during a second half of the current clock cycle, said current write address used for a write operation implemented during a subsequent clock cycle, wherein the write operation for the current clock cycle is timed independent of the current write address captured during said second half of the current clock cycle.

34 Claims, 4 Drawing Sheets

METHOD AND APPARATUS FOR IMPROVING CYCLE TIME IN A QUAD DATA RATE SRAM DEVICE

BACKGROUND OF INVENTION

The present invention relates generally to integrated circuit memory devices and, more particularly, to a method and apparatus for improving cycle time in a Quad Data Rate (QDR) Static Random Access Memory (SRAM) device.

Quad Data Rate (QDR) SRAM devices are currently being manufactured using a high-speed CMOS fabrication process. At the heart of the QDR architecture are two separate Double Data Rate (DDR) ports to allow simultaneous access to the memory storage array. Each port is dedicated, with one performing read operations while the other performs data write operations. By allowing two-way access to the memory array at DDR signaling rates, a quad data rate (QDR) is established.

A QDR SRAM system employs dual circuitry for both the address registers and logic controllers, thus allowing for the dual port architecture. While the WRITE port stores data into the memory storage array, the READ port can simultaneously retrieve data from therefrom. A single reference clock generator controls the speeds of both ports. One signal is passed to both logic controllers, resulting in a smooth flow of data. In addition, the clock generator controls the speed of the read and write data registers, providing consistent core bandwidth and operating rates. If individual timing signals were employed for each circuit, the signals could be slightly mismatched, thus resulting in a stall or crash of the memory system.

In earlier generation double data rate (DDR) devices, the core operations are directly timed from only the rising edge of the reference clock signal. As each address operation is performed, only two data operations can occur. Address operations are performed only during the rising edge of the clock signal. Because only one common data bus (port) is available, simultaneous read and write operations are not available with this technology. Unfortunately, even at higher megahertz clock speeds, DDR SRAM is challenged to provide sufficient bandwidth required by today's high-speed network communications equipment.

In comparison, the differences of QDR signaling versus DDR are evident. In order to facilitate a quad data rate, all data is carried by separate read and write ports. By using a DDR clock with two ports, information can be transferred at four data items per clock (assuming two operations are needed, one read and one write). However, notwithstanding the improved bandwidth provided by QDR SRAM in performing the read operation during the first half of the clock phase and the write operation during the second half of the clock phase, the maximum cycle time of the QDR SRAM is still limited since both the read and the write operations must be performed within one-half clock cycle. In essence, the SRAM performs a complete read and precharge, then a complete write and precharge, all within the same clock cycle.

Accordingly, it would be desirable to implement even further improvements in the cycle time of a QDR SRAM device, such as those used in high bandwidth applications like networking and communications systems.

SUMMARY OF INVENTION

The foregoing discussed drawbacks and deficiencies of the prior art are overcome or alleviated by a method for implementing a self-timed, read to write operation in a memory storage device. In an exemplary embodiment, the method includes capturing a read address during a first half of a current clock cycle, and commencing a read operation so as to read data corresponding to the captured read address onto a pair of bit lines. A write operation is commenced for the current clock cycle so as to cause write data to appear on the pair of bit lines as soon as the read data from the captured read address is amplified by a sense amplifier, wherein the write operation uses a previous write address captured during a preceding clock cycle. A current write address is captured during a second half of the current clock cycle, said current write address used for a write operation implemented during a subsequent clock cycle, wherein the write operation for the current clock cycle is timed independent of the current write address captured during said second half of the current clock cycle.

In another embodiment, a method for implementing a self-timed, read to write protocol for a Quad Data Rate (QDR) Static Random Access Memory (SRAM) device includes capturing a read address during a first half of a current clock cycle, and commencing a read operation so as to read data corresponding to the captured read address onto a pair of bit lines. A write operation is commenced for the current clock cycle so as to cause write data to appear on the pair of bit lines as soon as the read data from the captured read address is amplified by a sense amplifier, wherein the write operation uses a previous write address captured during a preceding clock cycle. A current write address is captured in a write address buffer during a second half of the current clock cycle, the current write address to be used for a write operation implemented during a subsequent clock cycle, wherein the write operation for the current clock cycle is timed independent of the current write address captured during the second half of the current clock cycle.

BRIEF DESCRIPTION OF DRAWINGS

Referring to the exemplary drawings wherein like elements are numbered alike in the several Figures.

DETAILED DESCRIPTION

Disclosed herein is a method and apparatus for improving cycle time in a Quad Data Rate (QDR) Static Random Access Memory (SRAM) device, in which write addresses and data are captured and buffered to be used in a subsequent read to write cycle thus allowing the write operation to be timed immediately after the read operation. The start of the write operation does not wait until addresses and data are captured. Instead, the write address and data captured in the preceding cycle is used for the write operation of the current cycle, while the write address and data captured the current cycle is actually written in the next cycle.

In a conventionally configured network QDR SRAM device, the protocols dictate a read operation during the first half of the clock cycle and a write operation during the second half of the clock cycle. For example, as illustrated in the timing diagram of FIG. 1, addresses A and B correspond to the read and write addresses, respectively. The write data for address B is input in double data rate mode on both the rising and falling edges of the clock signal. The write operation may only start as soon as the corresponding write addresses and data are captured and distributed internally, as reflected by the Internal Write Data signal in FIG. 1. During the read cycle, activation of the word line (WL) signal starts a bit line signal development as shown by the signal differential on the complement and true bit-lines BLC/BLT. Then, the sense amplifier (SA) data lines are amplified once the SET signal is activated.

Figure 1:
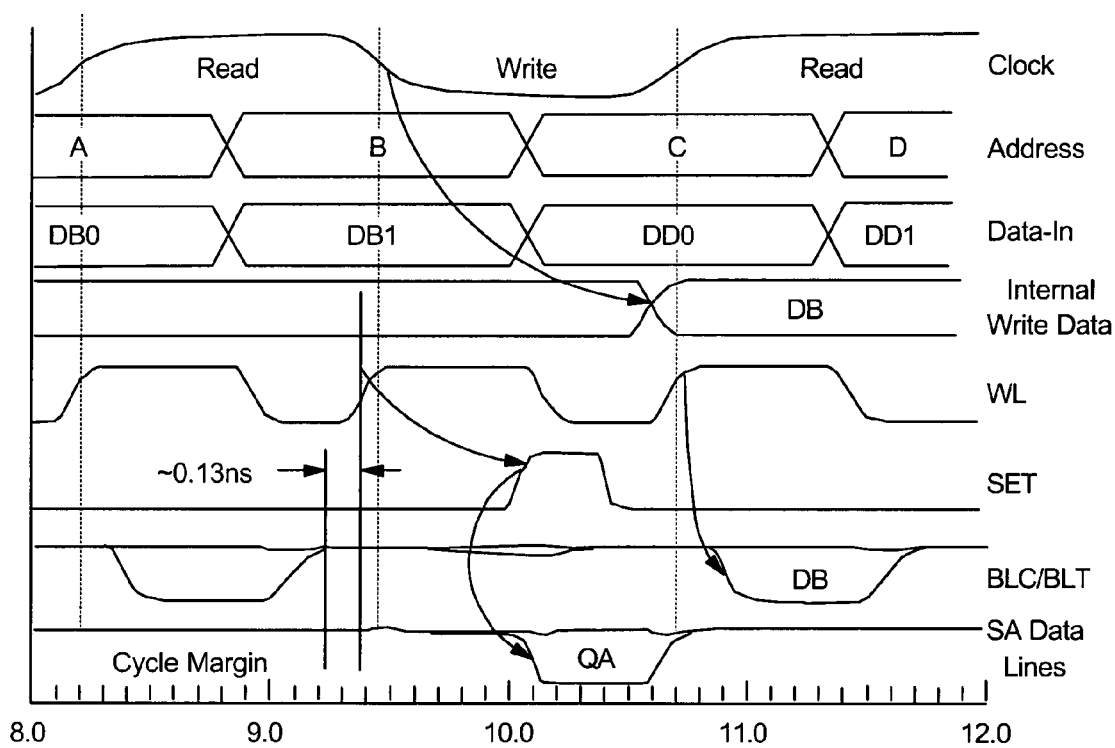
FIG. 1 is a timing diagram illustrating the operation of a conventionally configured network QDR SRAM device.

Following the read cycle, the write WL is decoded and the write data (DB) is written to the bit lines. In this protocol, cycle time margin is measured from the completion of the previous write cycle to the activation of the read WL for the current cycle. In the example illustrated, the 2.5 ns external cycle simulation of FIG. 1 shows a cycle time margin of only about 0.13 ns.

Therefore, in accordance with an embodiment of the invention, there is disclosed a method and apparatus for improving cycle time in a QDR SRAM device. Briefly stated, an improvement in the cycle time is achieved by implementing a self-timed read to write protocol in which write addresses and data are captured and buffered during a given read to write cycle are actually written in the next read to write cycle. As such, the write operation (of data and address captured in the previous cycle) may be timed immediately after the read operation of the current cycle. This capability is realized, in part, by generating a pair of write clock signals: one write clock for capturing previous cycle write and address data, and another write clock (delayed) for launching the internal write address captured during the previous cycle.

Figure 2A:
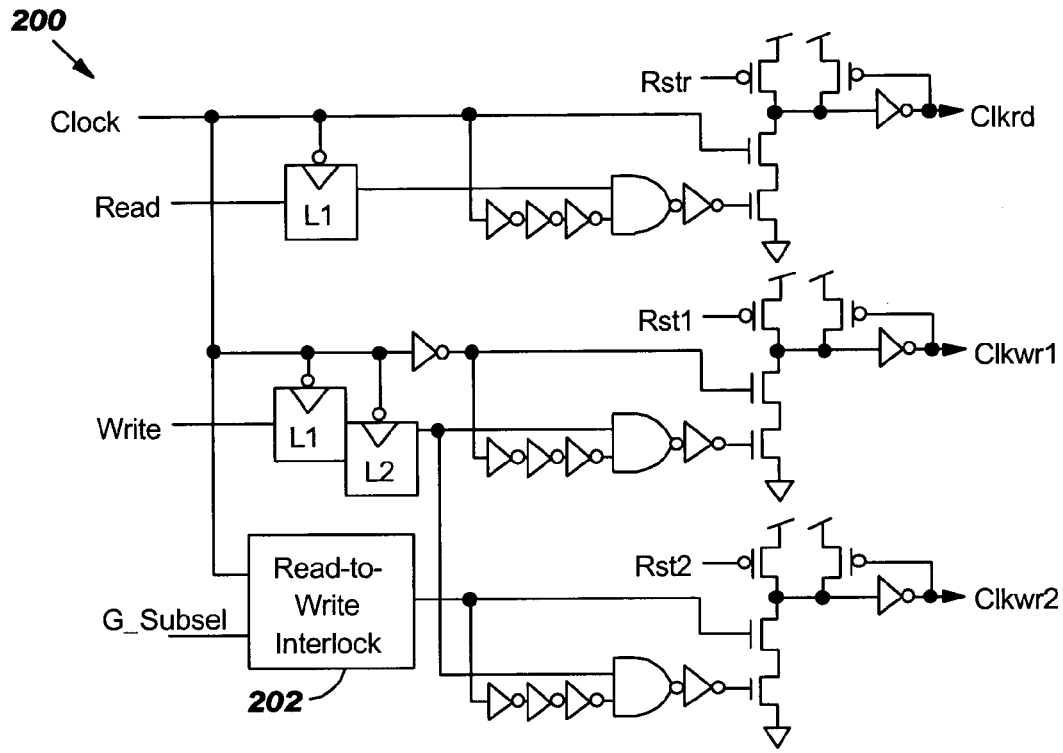
FIGS. 2(a) and 2(b) are schematic diagrams of an apparatus for implementing a self-timed, read to write protocol for a QDR SRAM device, in accordance with an embodiment of the invention.
Figure 2B:
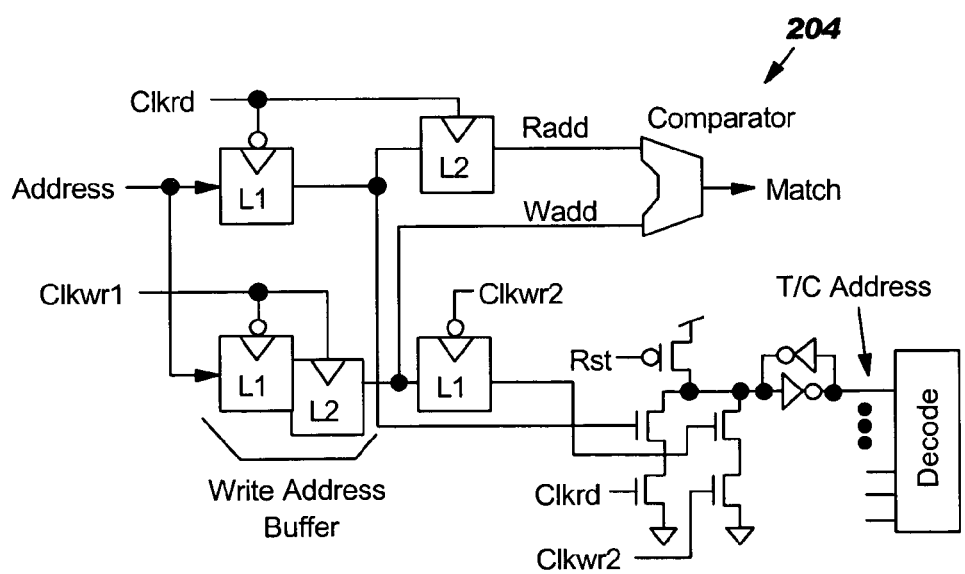

Referring generally now to FIGS. 2(a) and 2(b), there is shown a schematic diagram of one possible embodiment of an apparatus 200 for implementing a self-timed read to write protocol for a QDR SRAM device. In particular, apparatus 200 generates three self-resetting clock signals (labeled "Clkrd", "Clkwr1", "Clkwr2") from read/write commands, as well as a system clock (labeled "Clock"). The signals Clkrd and Clkwr1 are used to capture read and write addresses from rising and falling edges of Clock, respectively. In addition, Clkrd is also used to generate internal true and complement data addresses. Clkwr2 is a delayed version of Clkrd that is used to launch the internal write address from the current buffered write address (i.e., the earlier write-cycle address) previously captured by Clkwr1.

It will be appreciated that the Clkwr2 timing is not critical, since the precise timing between read and write cycles in a given array (or subarray) is locally controlled therein. As described in further detail hereinafter, a read to write interlock 202 includes sense amplifier interlock logic used to drive a set signal to the array sense amplifiers for a read operation, to isolate the sense amplifier from the bit lines through a pair of read bit switches, to enable a subarray (including word line) reset operation, and to enable a write activate signal that activates a pair of write bit switches for beginning the write operation.

As shown in FIG. 2(b), address compare logic 204 is used to fetch read data directly from a write data buffer, rather to than from the array itself, whenever data from the address to be read has not yet been written to memory. Thus, the read address (Radd) and the write address (Wadd) are compared with one another on every write cycle, wherein a signal (Match) is generated if the two addresses are equal.

Figure 3:
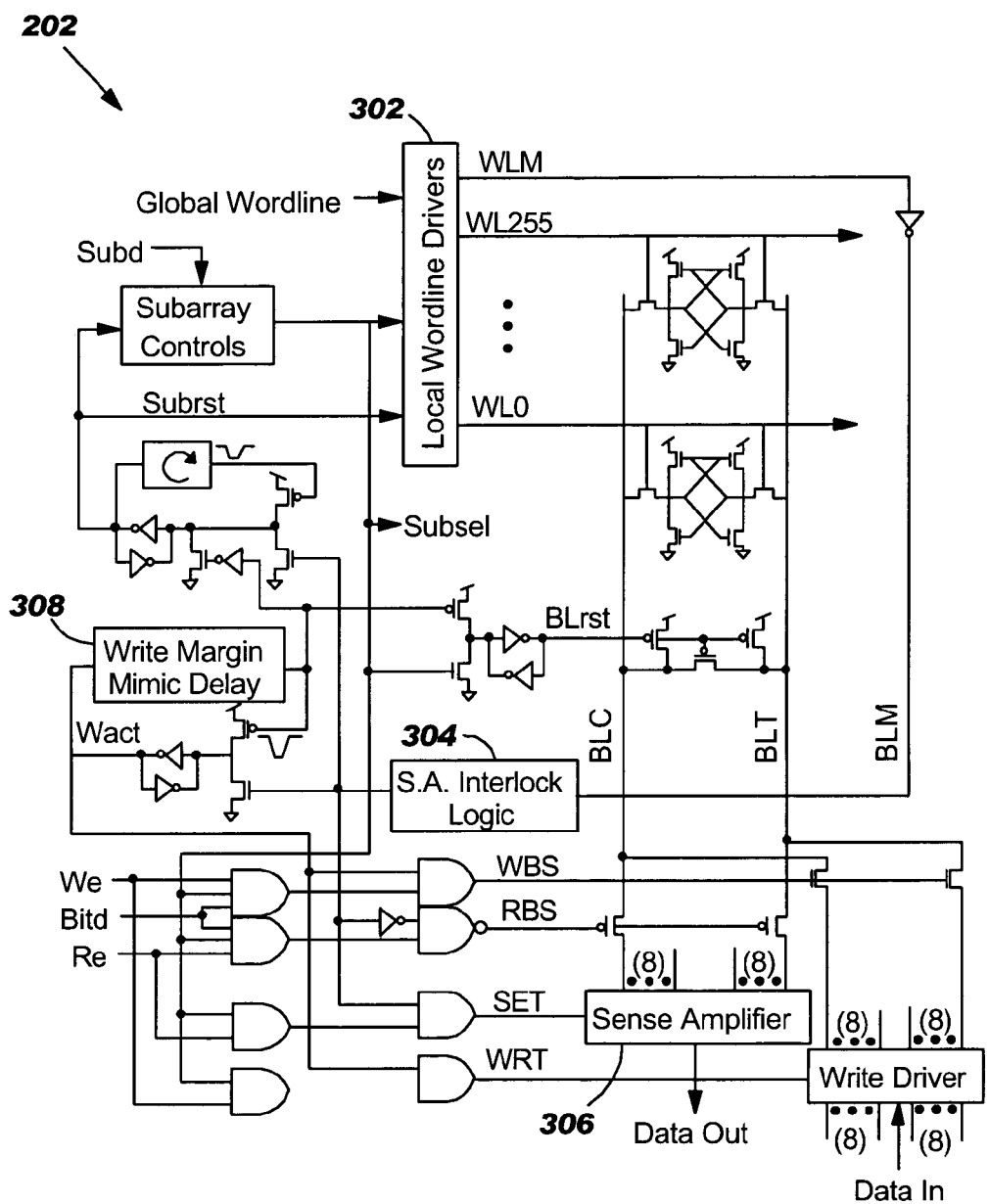
FIG. 3 is a schematic diagram illustrating the read to write interlock portion of the apparatus shown in FIG. 2(a)

FIG. 3 is a schematic diagram illustrating the read to write interlock 202 shown in FIG. 2(a). As is shown, signals "Subd", "We", "Re"and "Bitd"are subarray-decode, write, read and bit-decode pulse input controls signals to the subarray, which is accessed through a plurality of local word line drivers 302. For a selected subarray, the signal "Subsel"disables the bit line restore (i.e., precharging) devices through the signal labeled "BLrst", and also enables the individual word lines (e.g., WL0 . . . WL255) and read bit switches (through signal RBS). In addition, through the use of a mimic (i.e., dummy) word line (WLM) and bit line (BLM), a signal sent therethrough is capable of tracking the delay through an actual word line and bit line. Moreover, WLM/BLM is also used to time the bit line signal development to as to ensure an adequate signal development at the sense amplifier.

As indicated earlier, the sense amplifier interlock logic 304 includes four functions: driving the SET signal to the sense amplifier(s) 306; disabling the read bit switches (through signal RBS) in order to isolate the sense amplifier from the bit lines; enabling a subarray reset (including read word line reset); and enabling signal WRT to activate a pair of write bit switches (activated by signal WBS) to start the write operation. Once the write operation begins, a Write Margin Mimic Delay circuit 308 times the duration of the write operation. The mimic delay circuit 308 provides a more precise timing of the write to the cell, as compared to the previous approach of using a read mimic bit line delay. The end of the write operation occurs when the mimic delay circuit disables signal WBS, enables precharging signal BLrst, and regenerates a second "Subrst"pulse that restores the write word line. Thus, the subarray timings are restored twice: first at the setting of the sense amplifier, and then again at the end of the write duration pulse.

Figure 4:
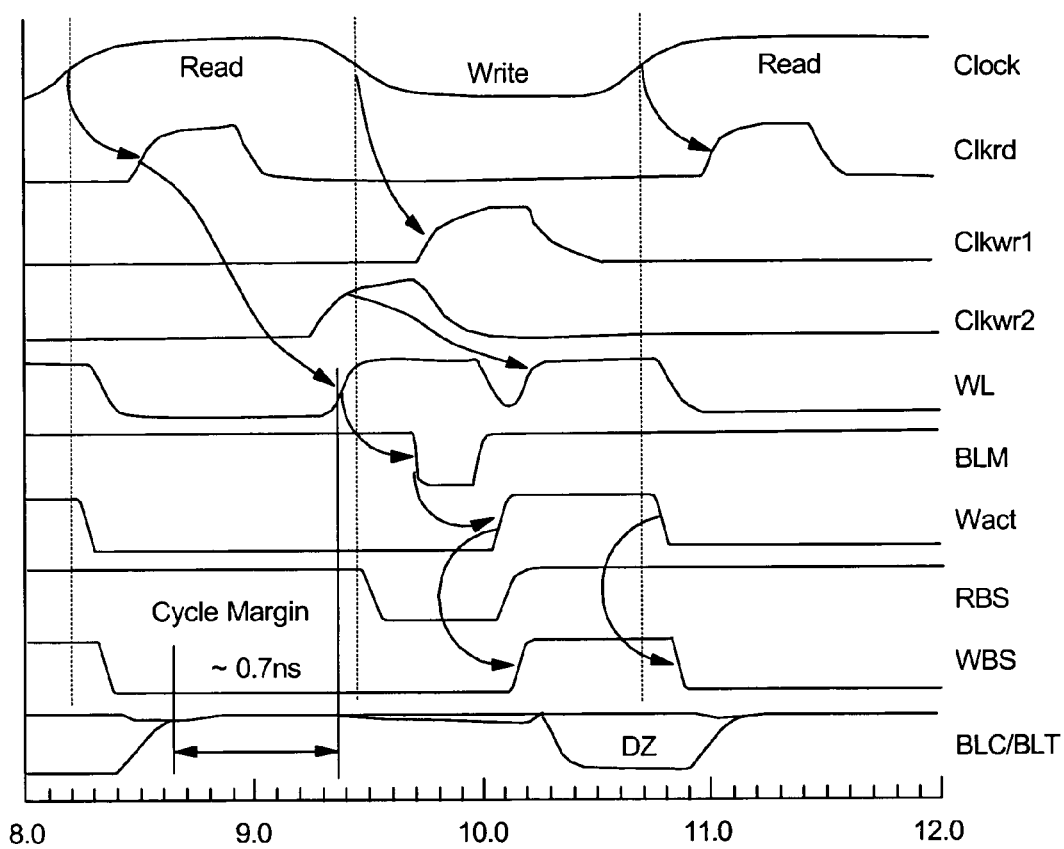
FIG. 4 is a timing diagram illustrating a simulation of the self-timed, read to write protocol, in accordance with a further embodiment of the present invention.

FIG. 4 is a timing diagram illustrating a simulation of the self-timed, read to write protocol, in accordance with a further embodiment of the present invention. At the first rising edge of the main clock, the read portion of the read to write cycle commences. Internally, it is noted the write operation for the previous half-cycle is finishing up, as reflected by the deactivation of the previously addressed word line (signals WL, Wact go from high to low), and the deactivation of the write bit switches (WBS also goes low) to decouple the bit line pair from the write driver. In addition, the fully developed data signal on the bit lines BLC/BLT disappears as the voltage on both is restored to the precharge value of $V_{DD}$.

At some point during the read half-cycle, the internally generated read clock signal Clkrd (from FIG. 2(a)) goes high to capture the read data and address for the current cycle. Once the addressed wordline signal (WL) is activated by going high and the read bit switches are activated (by RBS going low), an appropriate signal development takes place on the bit line pair BLC/BLT which will then be set and driven to the full swing value by the sense amplifier. It will also be noted, however, that at about the same point in time as the word line signal goes high for the read operation, the internally generated clock signal Clkwr2 (the delayed version of Clkrd) is activated to begin the write operation immediately after the sense amplifier captures the read data.

Again, the write operation for a given cycle does not depend upon waiting to capture write data and address information during the second half of the current clock cycle, because such information was already captured in the prior cycle. Thus, Clkwr2 is generated from Clkrd to launch the previously captured write address after the current read address is launched. The active low signal on the mimic bit line (BLM) activates write activation signal Wact, which in turn enables signal WBS for immediate writing of the write data (DZ) onto the bit line pair. There is no need to precharge the bit line pair once the read data is captured by the sense amplifier BL restore after the read operation; as can be seen in FIG. 4, once the read word line signal is reset and the read bit switches are disabled (RBS goes high), the bit line pair is driven by write data. Finally, after the execution of the write margin mimic delay (i.e., the falling edge of signal Wact) the write bit switches are uncoupled, the write word line is restored and the bit lines BLC/BLT are precharged.

As will be appreciated, the cycle time margin achieved in the simulation of FIG. 4 is about 0.7 ns, which is a significant improvement over 0.13 ns in the conventional scheme of FIG. 1. Given a 2.5 ns external cycle, then, a cycle time margin of 0.7 ns allows the external cycle time to be reduced to about 1.8 ns.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing a self-timed, read to write operation in a memory storage device, the method comprising:
    capturing a read address during a first half of a current clock cycle;
    commencing a read operation so as to read data corresponding to said captured read address onto a pair of bit lines;
    commencing a write operation for said current clock cycle so as to cause write data to appear on said pair of bit lines as soon as said read data from said captured read address is amplified by a sense amplifier, wherein said write operation uses a previous write address captured during a preceding clock cycle; and
    capturing a current write address during a second half of said current clock cycle, said current write address to be used for a write operation implemented during a subsequent clock cycle;
    wherein said commencing a write operation for said current clock cycle is timed independent of said current write address captured during said second half of said current clock cycle.

2. The method of claim 1, further comprising:
    generating an internal read clock signal from a main clock signal;
    generating a first internal write clock signal from said main clock signal, said first internal write clock signal used for said capturing a current write address; and
    generating a second internal write clock signal from said main clock signal, said second internal write clock signal used for commencing a write operation for said current clock cycle;
    wherein said second internal write clock signal is also a delayed version of said internal read clock signal.

3. The method of claim 2, further comprising implementing sense amplifier interlock logic to enable said write operation to cause write data to appear on said pair of bit lines as soon as said read data from said captured read address is amplified by said sense amplifier.

4. The method of claim 3, wherein said sense amplifier interlock logic utilizes a mimic word line to simulate a signal delay propagated through an actual word line and bit line during said read operation.

5. The method of claim 4, wherein said sense amplifier interlock logic is used to control a pair of read bit switches configured to selectively couple said bit lines to said sense amplifier, and said sense amplifier interlock logic is further used to control a pair of write bit switches configured to selectively couple said bit lines to a write driver.

6. The method of claim 5, wherein said sense amplifier interlock logic is used to reset a subarray of the memory storage device and disable a read-operation word line prior to the start of said write operation.

7. The method of claim 6, wherein said sense amplifier interlock logic is used to reset said subarray of the memory storage device, disable a write-operation word line, and initiate a bit line precharge operation using a write margin mimic delay circuit configured to simulate the timing margin of said write operation.

8. The method of claim 6, wherein said sense amplifier interlock logic is used to control the operation of said write driver.

9. A method for implementing a self-timed, read to write protocol for a Quad Data Rate (QDR) Static Random Access Memory (SRAM) device, the method comprising:
    capturing a read address during a first half of a current clock cycle;
    commencing a read operation so as to read data corresponding to said captured read address onto a pair of bit lines;
    commencing a write operation for said current clock cycle so as to cause write data to appear on said pair of bit lines as soon as said read data from said captured read address is amplified by a sense amplifier, wherein said write operation uses a previous write address captured during a preceding clock cycle; and
    capturing, in a write address buffer, a current write address during a second half of said current clock cycle, said current write address to be used for a write operation implemented during a subsequent clock cycle;
    wherein said commencing a write operation for said current clock cycle is timed independent of said current write address captured during said second half of said current clock cycle.

10. The method of claim 9, further comprising:
    generating an internal read clock signal from a main clock signal;
    generating a first internal write clock signal from said main clock signal, said first internal write clock signal used for said capturing a current write address; and
    generating a second internal write clock signal from said main clock signal, said second internal write clock signal used for commencing a write operation for said current clock cycle;
    wherein said second internal write clock signal is also a delayed version of said internal read clock signal.

11. The method of claim 10, further comprising implementing sense amplifier interlock logic to enable said write operation to cause write data to appear on said pair of bit lines as soon as said read data from said captured read address is amplified by said sense amplifier.

12. The method of claim 11, wherein said sense amplifier interlock logic utilizes a mimic word line to simulate a signal delay propagated through an actual word line and bit line during said read operation.

13. The method of claim 12, wherein said sense amplifier interlock logic is used to control a pair of read bit switches configured to selectively couple said bit lines to said sense amplifier, and said sense amplifier interlock logic is further used to control a pair of write bit switches configured to selectively couple said bit lines to a write driver.

14. The method of claim 13, wherein said sense amplifier interlock logic is used to reset a subarray of the memory storage device and disable a read-operation word line prior to the start of said write operation.

15. The method of claim 14, wherein said sense amplifier interlock logic is used to reset said subarray of the memory storage device, disable a write-operation word line, and initiate a bit line precharge operation using a write margin mimic delay circuit configured to simulate the timing margin of said write operation.

16. The method of claim 14, wherein said sense amplifier interlock logic is used to control the operation of said write driver.

17. The method of claim 9, further comprising:
comparing said current write address in said write address buffer with said current read address; and
upon determining a match between said current read address and said current write address, fetching said read data from a write data buffer.

18. A semiconductor memory storage device, comprising:
circuitry configured to capture a read address during a first half of a current clock cycle;
circuitry configured to commence a read operation so as to read data corresponding to said captured read address onto a pair of bit lines;
circuitry configured to commence a write operation for said current clock cycle so as to cause write data to appear on said pair of bit lines as soon as said read data from said captured read address is amplified by a sense amplifier, wherein said write operation uses a previous write address captured during a preceding clock cycle; and
circuitry configured to capture a current write address during a second half of said current clock cycle, said current write address to be used for a write operation implemented during a subsequent clock cycle;
wherein said write operation for said current clock cycle is timed independent of said current write address captured during said second half of said current clock cycle.

19. The memory storage device of claim 18, further comprising:
circuitry configured to generate an internal read clock signal from a main clock signal;
circuitry configured to generate a first internal write clock signal from said main clock signal, said first internal write clock signal used for said capturing a current write address; and
circuitry configured to generate a second internal write clock signal from said main clock signal, said second internal write clock signal used for commencing a write operation for said current clock cycle;
wherein said second internal write clock signal is also a delayed version of said internal read clock signal.

20. The method of claim 19, further comprising sense amplifier interlock logic configured to enable said write operation to cause write data to appear on said pair of bit lines as soon as said read data from said captured read address is amplified by said sense amplifier.

21. The memory storage device of claim 20, wherein said sense amplifier interlock logic utilizes a mimic word line to simulate a signal delay propagated through an actual word line and bit line during said read operation.

22. The memory storage device of claim 21, wherein said sense amplifier interlock logic is configured to control a pair of read bit switches configured to selectively couple said bit lines to said sense amplifier, said sense amplifier interlock logic further configured to control a pair of write bit switches configured to selectively couple said bit lines to a write driver.

23. The method of claim 22, wherein said sense amplifier interlock logic is configured to reset a subarray of the memory storage device and disable a read-operation word line prior to the start of said write operation.

24. The memory storage device of claim 23, wherein said sense amplifier interlock logic is configured to reset said subarray of the memory storage device, disable a write-operation word line, and initiate a bit line precharge operation using a write margin mimic delay circuit configured to simulate the timing margin of said write operation.

25. The memory storage device of claim 22, wherein said sense amplifier interlock logic is configured to control the operation of said write driver.

26. A Quad Data Rate (QDR) Static Random Access Memory (SRAM) device, comprising:
circuitry configured to capture a read address during a first half of a current clock cycle;
circuitry configured to commence a read operation so as to read data corresponding to said captured read address onto a pair of bit lines;
circuitry configured to commence a write operation for said current clock cycle so as to cause write data to appear on said pair of bit lines as soon as said read data from said captured read address is amplified by a sense amplifier, wherein said write operation uses a previous write address captured during a preceding clock cycle; and
circuitry configured to capture, in a write address buffer, a current write address during a second half of said current clock cycle, said current write address to be used for a write operation implemented during a subsequent clock cycle;
wherein said write operation for said current clock cycle is timed independent of said current write address captured during said second half of said current clock cycle.

27. The QDR SRAM device of claim 26, further comprising:
circuitry configured to generate an internal read clock signal from a main clock signal;
circuitry configured to generate a first internal write clock signal from said main clock signal, said first internal write clock signal used for said capturing a current write address; and
circuitry configured to generate a second internal write clock signal from said main clock signal, said second internal write clock signal used for commencing a write operation for said current clock cycle;
wherein said second internal write clock signal is also a delayed version of said internal read clock signal.

28. The QDR SRAM device of claim 27, further comprising sense amplifier interlock logic configured to enable said write operation to cause write data to appear on said pair of bit lines as soon as said read data from said captured read address is amplified by said sense amplifier.

29. The QDR SRAM device of claim 28, wherein said sense amplifier interlock logic utilizes a mimic word line to simulate a signal delay propagated through an actual word line and bit line during said read operation.

30. The QDR SRAM device of claim 29, wherein said sense amplifier interlock logic is configured to control a pair of read bit switches configured to selectively couple said bit lines to said sense amplifier, said sense amplifier interlock logic further configured to control a pair of write bit switches configured to selectively couple said bit lines to a write driver.

31. The QDR SRAM device of claim 30, wherein said sense amplifier interlock logic is configured to reset a subarray of the memory storage device and disable a read-operation word line prior to the start of said write operation.

32. The QDR SRAM device of claim 31, wherein said sense amplifier interlock logic is configured to reset said subarray of the memory storage device, disable a write-operation word line, and initiate a bit line precharge operation using a write margin mimic delay circuit configured to simulate the timing margin of said write operation.

33. The QDR SRAM device of claim 30, wherein said sense amplifier interlock logic is configured to control the operation of said write driver.

34. The QDR SRAM device of claim 26, further comprising:
   a comparator configured to compare said current write address in said write address buffer with said current read address; and
   circuitry configured to fetch said read data from a write data buffer upon determination of a match between said current read address and said current write address.

* * * * *